United States Patent [19]

Iijima et al.

[11] Patent Number: 4,879,674

[45] Date of Patent: Nov. 7, 1989

[54] INPUT CIRCUIT FOR A DIGITAL PHASE LOCKED LOOP

[75] Inventors: Kenzaburou Iijima; Yoshinori Hayashi, both of Shizuoka, Japan

[73] Assignee: Yamaha Corporation, Japan

[21] Appl. No.: 143,964

[22] Filed: Jan. 14, 1988

[30] Foreign Application Priority Data

Jan. 16, 1987 [JP] Japan .................................. 62-7904

[51] Int. Cl.[4] ............................................. G06F 15/31
[52] U.S. Cl. ........................... 364/724.03; 364/724.01
[58] Field of Search ............................... 375/120, 119; 364/724.01, 724.16, 572, 825, 724.03

[56] References Cited

U.S. PATENT DOCUMENTS

| | | | |
|---|---|---|---|
| 3,979,701 | 9/1976 | Tomozawa | 364/825 X |
| 4,356,558 | 10/1982 | Owen et al. | 364/724.01 |
| 4,531,221 | 7/1985 | Chung et al. | 364/724.16 X |
| 4,654,811 | 3/1987 | Jakubzick | 364/572 |

FOREIGN PATENT DOCUMENTS 62-211505 9/1987 Japan .

Primary Examiner—Gary V. Harkcom
Assistant Examiner—Tan V. Mai
Attorney, Agent, or Firm—Ostrolenk, Faber, Gerb & Soffen

[57] ABSTRACT

For reliable and stable detection of the movement of a mobile body, a pair of filters for performing specified and different calculations are interposed between an analog-digital (A/D) converter and a digital phase locked circuit. The calculations carried out by the filters are selectively utilized either alone or in combination to minimize noise present after A/D conversion.

2 Claims, 1 Drawing Sheet

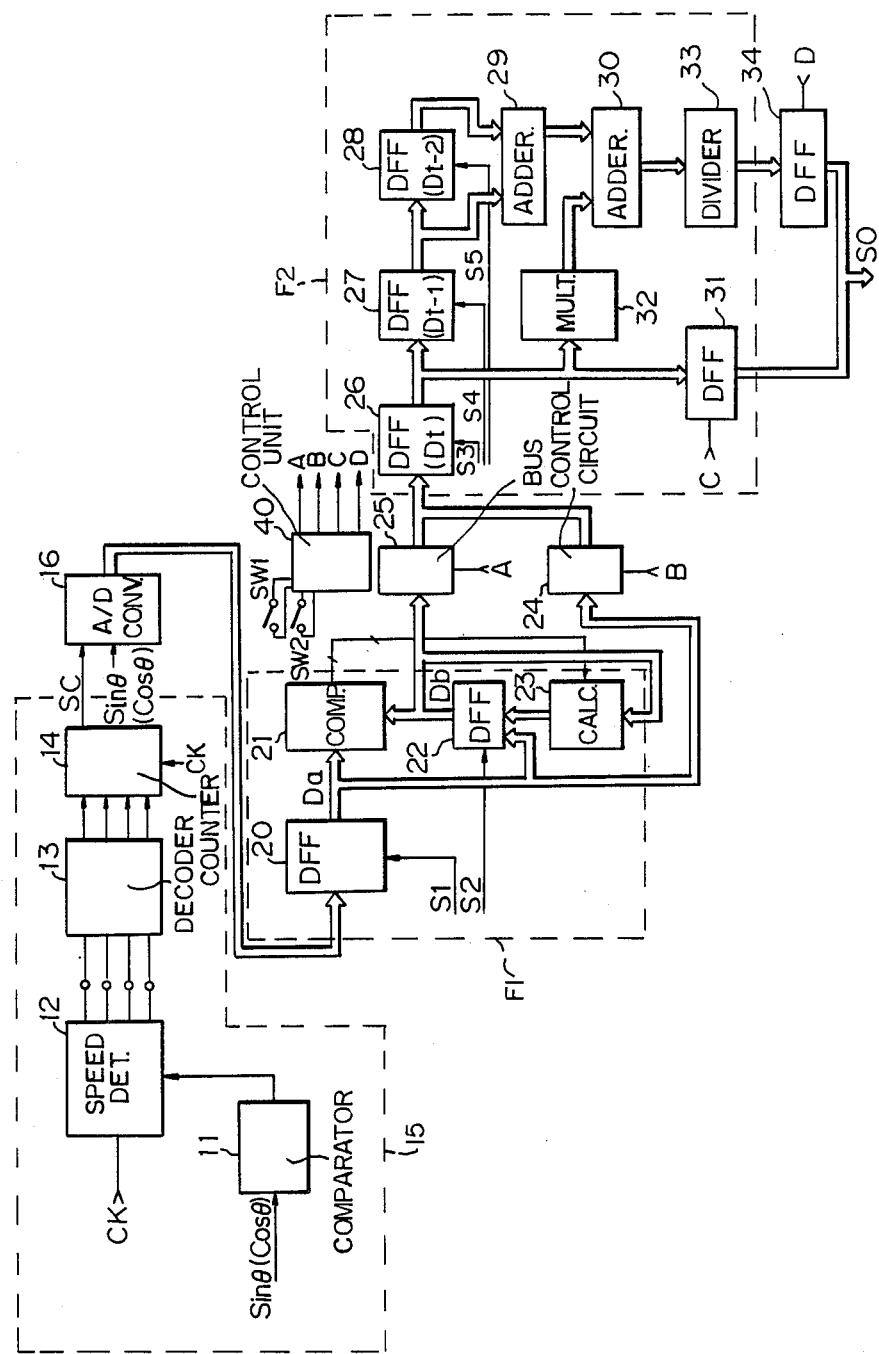

INPUT CIRCUIT FOR A DIGITAL PHASE LOCKED LOOP

BACKGROUND OF THE INVENTION

The present invention relates to an improved input circuit for a digital phase locked circuit, and more particularly relates to an improvement in the function of an input circuit for a digital phase locked loop used for detection of displacement of a mobile object via A/D (analog-digital) conversion.

A wide variety of detection circuits are currently proposed to detect the displacement of a mobile object through modulation of output signals from a detection encoder.

One example is proposed in Japanese patent application Sho. 61-54288 in which the detection circuit includes a digital phase locked loop. More specifically, an encoder issues analog signals $\sin\theta$ and $\cos\theta$ corresponding to the angular displacement $\theta$ of a mobile object. These analog signals $\sin\theta$ and $\cos\theta$ are then properly digitalized. A function generation ROM is separately provided to issue signals $\sin\phi$ and $\cos\phi$ on the basis of its address data. These signals $\sin\phi$ and $\cos\phi$ are multiplied with the digitalized signals $\sin\theta$ and $\cos\theta$, respectively. The products of multiplication are then compared with each other for calculation of a value $\sin(\theta-\phi)$. When the value $\sin(\theta-\phi)$ is positive, a signal $\overline{U}/D$ at "0" level is issued. Whereas a signal $\overline{U}/D$ at "1" level is issued when the value $\sin(\theta-\phi)$ is negative. The signal $\overline{U}/D$ is then passed to a counter which also receives a series of prescribed clock pulses. Upon receipt of the signal $\overline{U}/D$ at "0" level, the counter operates in an up-count mode. In contrast, the counter operates in a down-count mode on receipt of the signal $\overline{U}/D$ at "1" level. Output signals from the counter are properly latched in order to remove fluctuations in output.

In the case of such a detection circuit, the digital phase locked loop operates to ensure that the value $\sin(\theta-\phi)$ is equal to 0, i.e. $\theta$ is equal to $\phi$. In other words, the output signal from the counter corresponds to the angular displacement $\theta$ of the mobile object.

As is well known, the analog signals $\sin\theta$ and $\cos\theta$ occasionally include noise generated by the presence of disturbances and such noise cannot be removed during A/D conversion. As a consequence, the digitalized signals $\sin\theta$ and $\cos\theta$ are poor in stability due to the inclusion of such noise. In particular, even when the mobile object moves slowly the stability is degraded under the influence of high range noise due to the relatively wide frequency bands of converters used for the A/D conversion.

SUMMARY OF THE INVENTION

It is the object of the present invention to minimize the negative influence of noise in digitalized encoder outputs on a displacement detector to ensure high stability of the system output indicative of the displacement of a mobile object.

In accordance with a basic aspect of the present invention, a first filter for performing a first specified calculation is connected to an A/D converter, a second filter for performing a second specified calculation is connected to the A/D converter and to th first filter in a parallel connection, and the first and second calculations are selectively used individually or in combination in order to minimize noise included in an output signal to be passed from the A/D converter to a digital phase locked circuit.

BRIEF DESCRIPTION OF THE DRAWINGS

The attached drawing is a block diagram of one embodiment of the input circuit in accordance with the present invention.

DESCRIPTION OF THE PREFERRED EMBODIMENTS

In the drawing, the input circuit includes a comparator 11 connected to the output of an encoder (not shown) of a displacement detector. This comparator 11 converts an analog signal $\sin\theta$ or $\cos\theta$ from the encoder into a corresponding square wave. This comparator 11 is connected to a speed detector 12 for detecting the speed of displacement of a mobile object. This speed detector 12 also receives a series of prescribed clock pulses CK in order to measure the time period during which the output of the comparator is at the "1" level or the "0" level. Speed data issued by the speed detector 12 are passed to a decoder 13. The decoder 13 decodes the speed data to issue preset data which decrease in values as the displacement speed of the mobile object increases. A counter 14 is connected to the decoder 13 in order to receive the preset data. On receipt of each clock pulse, the counter 14 count downs the preset data from the decoder 13 and issues a conversion start signal SC when its count value becomes equal to 0. The conversion start signal SC is passed to an A/D converter 16. The above-described elements 11 to 14 form a sampling period switch circuit 15 which operates so that the sampling period of the A/D converter 16 is shortened every time the displacement speed of the mobile object increases.

The output signal from the A/D converter 16 is passed to a delay type flip-flop 20 of multiple bits which also receives a control signal S1 so that the output signal from the A/D converter 16 is read at the rising edge of the control signal. The delay type flip-flop 20 is connected on one hand to a comparator 21 and, on the other hand, to a bus control circuit 24. The comparator 21 receives an output signal Da from the delay type flip-flop 20 and an output signal Db from a delay type flip-flop 22 which is also connected to the delay type flip-flip 20. The comparator 21 is connected to an adder-subtracter or calculator 23 which is connected to the second delay type flip-flop 22. When the output signal Da from the first flip-flop 20 is larger than the output signal Db from the second flip-flop 22, the comparator 21 instructs the calculator 23 to perform a calculation (Db+1). However, when the output signal Da is smllaer than the output signal Db, a calculation (Db−1) is instructed. Further, output of an intact Db is instructed when both output signals Da and Db are equal to each other.

The second delay type flip-flop 22 also receives a control signal S2. At the initial stage, the delay type flip-flop 22 reads in the output signal Da at the rising edge of the second control signal S2 and, in subsequent stages, reads in the output signal from the calculator 23 at every subsequent rising edge of the second control signal S2. The comparator 21 is designed so that it should start its operation after the first output signal Da is issued from the first delay type flip-flop 20.

The above-described elements 20 to 23 form a filter F1, in which the output signal Da from the first delay type flip-flop 20 is given in the form of a current value $D_k$ whereas the output signal Db from the second delay type flip-flop 22 is given in the form of a single sample delayed value $D_{k-1}$. As a consequence, the first filter F1 operates as follows. When the output signal Da from the first delay type flip-flop 20 increases, 1 is acceded to the previous value $D_{k-1}$ to be issued as the current value $D_k$. When the output signal Db decreases, 1 is reduced from the previous value $D_{k-1}$ to be issued as the current value $D_k$. Further, when the output signal Da does not change, the previous value $D_k$ is issued as the current value $D_k$.

The output signal from this first filter F1 is passed to a bus control circuit 25, which also receives a signal A. The first and second bus control circuits 24 and 25 are designed so that they are set to open states when the signal A is equal to 1, and set to closed states when the signal A is equal to 0. The output signals from the both bus control circuits 24 and 25 are passed to a common delay type flip-flop 26. The third delay type flip-flop 26 is connected to a delay type flip-flop 28 via a delay type flip-flop 27. When the content of the third delay type flip-flop 26 is given in the form of a current value $D_t$, the content of the fourth delay type flip-flop 27 is given in the form of a one-time previous value $D_{t-1}$ and the content of the fifth delay type flip-flop 28 is given in the form of a two-times previous value $D_{t-2}$. The third to fifth delay type flip-flops 26 to 28 take in these values on receipt of control signals S3 to S5.

The output signal $D_t$ from the third delay type flip-flop 26 is passed to a multiplier 32 in order to be doubled. The output signals $D_{t-1}$ and $D_{t-2}$ from the fourth and fifth delay type flip-flops 27 and 28 are passed to a common adder 29 for addition. The output signal $2D_t$ from the multipler 32 and the output signal $(D_{t-1}+D_{t-2})$ from the first adder 29 are passed to an adder 30 whose output signal $(2 \cdot D_t + D_{t-1} + D_{t-2})$ is passed to a divider 33 for division by 4. A delay type flip-flop 31 is connected to the third delay type flip-flop 26 in order to receive the output signal $D_t$. The sixth delay type flip-flop 31 receives a signal C also. Thus, an output signal $(2 \cdot D_t + D_{t-1} + D_{t-2})/4$ from the divider 33 is transmitted outside the system via a delay type flip-flop 34 which also receives a signal D, and the output signal $D_t$ from the third delay type flip-flop 26 is also transmitted outside the system via the sixth delay type flip-flop 31. The sixth and seventh delay type flip-flops 31 and 34 read in input signals at rising edges of the signals C and D.

The above-described elements 26 to 33 form a filter F2 which performs a calculation $(2 \cdot D_t + D_{t-1} + D_{t-2})/4$. Here the current value $D_t$ is doubled so that the calculation strongly reflects the present condition.

The above-described signals A to D are issued by a control unit 40 accompanied with a pair of switches SW1 and SW2. The control unit 40 operates in one of the following three modes depending on the states of the switches SW1 and SW2.

(I) The signal A for the second bus control circuit 25 is set to "1" level and the signal B for the first bus control circuit 24 is set to "0" level. The signal C for the sixth delay type flip-flop 31 is raised at a prescribed timing so that the output signal from the first filter F1 should be transmitted outside the system.

(II) The signal B is set to "1" level and the signal A to "0" level. The signal D for the seventh delay type flip-flop 34 is raised at a prescribed timing so that the output signal from the second filter F2 should be transmitted outside the system.

(III) The signal A is set to "1" level and the signal B to "0" level. This signal D is raised at a prescribed common timing so that calculation by the second filter F2 should be performed subsequent to that by the first filter F1 and the output signal from the filter F2 should be transmitted outside the system.

The input circuit of the present invention operates as follows with the above-described construction.

As stated above, the first filter F1 performs one of the calculations $D_k=(D_{k-1}+1)$, $D_k=(D_{k-1}-1)$ and $D_k=D_{k-1}$ depending on the change in value of the output signal Da after A/D conversion. The second filter F2 performs the calculation $(2 \cdot D_t + D_{t-2})/4$.

When the control unit 40 operates in the mode I, the system output signal SO is given in the form the output signal issued after the calculation by the first filter 1 only. The output signal then takes a value equal to the previous value or a value one bit larger or smaller than the previous value. So, even when any noise is included after the A/D conversion, the corresponding output signal fluctuates by one bit only and, as a consequence, the negative influence of the noise is greatly minimized or eliminated. Operation in this mode is used when a pulse type noise is intermittently generated over a sine wave input signal having a small dv/dt, i.e. a change in voltage per time.

When the control unit 40 operates in the mode II, the system output signal SO is given in the form of the output signal issued after the calculation by the second filter F2 only. The output signal then takes a value roughly equal to the average of three successive values. So, even when any noise is included after the A/D conversion, the negative influence of the noise can be greatly minimized through averaging.

When the control unit 40 operates in the mode III, the system output signal SO is given in the form of the output signal after sequential calculations by the first and second filters F1 and F2. Thanks to the effect of the double calculations, the influence of noise is significantly minimized.

Further, thanks owing to use of the sampling period switch circuit 15, a longer sampling period is allotted to an input signal of a low frequency. As a consequence, it is not necessary to unduly broaden the frequency band of the A/D converter, thereby also reducing noises.

The invention claimed is:

1. An input circuit for a digital phase locked loop circuit, the input circuit comprising;
   an A/D converter having means to receive an input signal;
   a first filter coupled to said A/D converter and performing a first calculation $(D_{k-1}+1)$ when $D_k$ is larger than $D_{k-1}$, a second calculation $(D_{k-1}-1)$ when $D_k$ is smaller than $D_{k-1}$, and a third calculation $(D_{k-1})$ when $D_k$ is equal to $D_{k-1}$, wherein $D_k$ and $D_{k-1}$ are current and one-time previous values of a first output signal from said A/D converter;
   a second filter coupled to said A/D converter via said first filter and performing a fourth calculation $(2 \cdot D_t + D_{t-1} + D_{t-2})/4$, wherein $D_t$, $D_{t-1}$ and $D_{t-2}$ are current, one-time previous and two-times previous values of a second output signal from said A/D converter; and
   means for selectively transferring a signal to the digital phase locked circuit after either said calculation by said first filter, after said calculation by second filter, or after said calculations by both said first and second filters.

2. An input circuit as claimed in claim 1, further comprising a sampling period switch coupled to said A/D converter for adjusting the sampling period of the A/D converter depending on the frequency of an input signal.

* * * * *